(12) United States Patent
Suenaga et al.

(10) Patent No.: US 8,310,135 B2
(45) Date of Patent: Nov. 13, 2012

(54) PIEZOELECTRIC THIN FILM ELEMENT AND PIEZOELECTRIC THIN FILM DEVICE INCLUDING THE SAME

(75) Inventors: Kazufumi Suenaga, Tsuchiura (JP); Kenji Shibata, Tsukuba (JP); Hideki Sato, Hamamatsu (JP); Akira Nomoto, Kasumigaura (JP)

(73) Assignee: Hitachi Cable, Ltd., Tokyo (JP)

( * ) Notice: Subject to any disclaimer, the term of this patent is extended or adjusted under 35 U.S.C. 154(b) by 331 days.

(21) Appl. No.: 12/797,340

(22) Filed: Jun. 9, 2010

(65) Prior Publication Data
US 2010/0314972 A1  Dec. 16, 2010

(30) Foreign Application Priority Data
Jun. 10, 2009  (JP) ................................ 2009-139417

(51) Int. Cl.
*H01L 41/187* (2006.01)
(52) U.S. Cl. .................. 310/358; 501/134; 252/62.9 PZ
(58) Field of Classification Search .................. 310/358; 501/134; 252/62.9 PZ; 257/347
See application file for complete search history.

(56) References Cited

U.S. PATENT DOCUMENTS

| | | | |
|---|---|---|---|
| 6,347,862 B1 | 2/2002 | Kanno et al. | |
| 7,309,450 B2 * | 12/2007 | Nanao et al. | 252/62.9 R |
| 7,701,121 B2 * | 4/2010 | Oka et al. | 310/358 |
| 2007/0024162 A1 * | 2/2007 | Shibata et al. | 310/358 |
| 2009/0096328 A1 | 4/2009 | Shibata et al. | |
| 2009/0302715 A1 | 12/2009 | Shibata et al. | |
| 2010/0314972 A1 | 12/2010 | Suenaga et al. | |
| 2010/0320874 A1 * | 12/2010 | Suenaga et al. | 310/357 |
| 2011/0121690 A1 | 5/2011 | Shibata et al. | |
| 2011/0175488 A1 | 7/2011 | Shibata et al. | |
| 2011/0187237 A1 | 8/2011 | Suenaga et al. | |

FOREIGN PATENT DOCUMENTS

| | | | |
|---|---|---|---|
| JP | 10286953 A | | 10/1998 |
| JP | 2007019302 A | | 1/2007 |
| JP | 2007324538 A | * | 12/2007 |
| JP | 2008263132 A | * | 10/2008 |
| JP | 2009-117785 A | | 5/2009 |
| JP | 2009-295786 A | | 12/2009 |
| JP | 2010-16018 A | | 1/2010 |

OTHER PUBLICATIONS

Supervised by Kiyoshi Nakamura, Higher performance of piezoelectric material and advanced applied technology, published by Science & Technology in 2007, p. 150-151.

* cited by examiner

*Primary Examiner* — Jaydi San Martin
(74) *Attorney, Agent, or Firm* — Martin Fleit; Paul D. Bianco; Fleit Gibbons Gutman Bongini & Bianco PL

(57) ABSTRACT

A piezoelectric thin film element is provided, including on a substrate: a piezoelectric thin film expressed by a general formula $(Na_xK_yLi_z)NbO_3$ ($0 \leq x \leq 1$, $0 \leq y \leq 1$, $0 \leq z \leq 0.2$, $x+y+z=1$); and an upper electrode laminated thereon, wherein the piezoelectric thin film has a crystal structure of any one of a pseudo-cubic crystal, a tetragonal crystal, or an orthorhombic crystal, or has a crystal structure of coexistence of at least two of the pseudo-cubic crystal, the tetragonal crystal, or the orthorhombic crystal, and in such crystal structures, there is a coexistence of (001) oriented crystal grains oriented in (001) direction, and (111) oriented crystal grains oriented in (111) direction, with an angle formed by at least one of the crystal axes of the crystal grains and a normal line of the substrate surface set to be in a range of 0° to 10°.

19 Claims, 16 Drawing Sheets

(a)

(b)

(a)

(b)

(a)

(b)

(c)

(a)

(b)

(a)

(b)

(a)

(b)

(a)

(b)

PIEZOELECTRIC THIN FILM ELEMENT AND PIEZOELECTRIC THIN FILM DEVICE INCLUDING THE SAME

The present application is based on Japanese Patent Application No.2009-139417, filed on Jun. 10, 2009, the entire contents of which are hereby incorporated by reference.

BACKGROUND

1. Technical Field

The present invention relates to a piezoelectric thin film element having a piezoelectric thin film made of lithium potassium sodium niobate, and a piezoelectric thin film device including the same.

2. Description of Related Art

A piezoelectric body is processed into various piezoelectric elements according to the purpose of use, and is broadly utilized particularly as a functional electronic component such as an actuator for adding voltage to cause deformation to occur, and a sensor for generating voltage from the deformation of the elements reversely. As the piezoelectric body utilized for the purpose of the actuator and the sensor, a lead-based dielectric material having great piezoelectric characteristics, and particularly a $Pb(Zr_{1-x}Ti_x)O_3$-based perovskite type ferroelectric material called PZT has been broadly used, and normally is formed by sintering an oxide material composed of individual elements. Further, in recent years, it is desired to develop the piezoelectric body not containing lead in consideration of an environment, and development of lithium potassium sodium niobate (general formula: $(Na_xK_yLi_z)NbO_3$ ($0 \leq x \leq 1$, $0 \leq y \leq 1$, $0 \leq z \leq 0.2$, $x+y+z=1$), etc, has been accelerated. The lithium potassium sodium niobate has the piezoelectric characteristics comparable to PZT, and therefore is expected as an important candidate of a non-lead piezoelectric material.

Meanwhile, at present, as a smaller size and higher performance of each kind of electronic component are accelerated, a smaller-sized piezoelectric element having higher performance is strongly requested. However, regarding the piezoelectric material manufactured by a conventional manufacturing method, by mainly a sintering method, when its thickness is 10 μm or less, the size of the piezoelectric material becomes close to sizes of crystal grains that constitute the material, and an influence thereof can not be ignored. Therefore, there is a problem that variation and deterioration of the characteristics become conspicuous. Accordingly, in order to avoid such a problem, in recent years, a method of forming the piezoelectric material using a thin film technique, etc, replacing the sintering method has been studied.

In recent years, a PZT thin film formed by RF sputtering is put to practical use as an actuator for a head of a highly precise high speed ink jet printer and a small-sized inexpensive Gyro sensor (for example, see patent document 1 and non-patent document 1). Further, patent document 2 also discloses a piezoelectric thin film element using a piezoelectric thin film made of lithium potassium sodium niobate and not using lead.

(Prior Art Document)
(Patent Document)
(Patent Document 1)
Japanese Patent Laid Open Publication No. 10-286953
(Patent Document 2)
Japanese Patent Laid Open Publication No. 2007-19302
(Non-patent document 1) Supervised by Kiyoshi Nakamura
Higher performance of piezoelectric material and advanced applied technology (published by science & technology in 2007)

SUMMARY OF THE INVENTION

By forming a piezoelectric thin film element having a non-lead based piezoelectric thin film, a head for a highly precise high speed ink jet printer and a small-sized inexpensive Gyro sensor can be manufactured. As a specific candidate of the piezoelectric thin film, a basic study of a thinner film of lithium potassium sodium niobate has been performed. Further, in order to reduce a cost in an aspect of application, it is inevitable to establish a technique of forming the piezoelectric thin film with good controllability on substrates such as a Si substrate and a glass substrate.

However, in a conventional technique, the piezoelectric thin film element showing a high dielectric constant and the piezoelectric thin film device using the same can not be stably produced.

Therefore, an object of the present invention is to provide the piezoelectric thin film element excellent in piezoelectric characteristics and productivity and the piezoelectric thin film device using the same.

According to an aspect of the present invention, a piezoelectric thin film element is provided, comprising on a substrate:

a piezoelectric thin film expressed by a general formula $(Na_xK_yLi_z)NbO_3$ ($0 \leq x \leq 1$, $0 \leq y \leq 1$, $0 \leq z \leq 0.2$, $x+y+z=1$); and an upper electrode laminated thereon, wherein the piezoelectric thin film has a crystal structure of any one of a pseudo-cubic crystal, a tetragonal crystal, or an orthorhombic crystal, or has a crystal structure of coexistence of at least two of the pseudo-cubic crystal, the tetragonal crystal, or the orthorhombic crystal, and in such crystal structures, there is a coexistence of (001) oriented crystal grains oriented in (001) direction, and (111) oriented crystal grains oriented in (111) direction, with an angle formed by at least one of the crystal axes of the crystal grains and a normal line of the substrate surface set to be in a range of 0° to 10°.

In this case, preferably the piezoelectric thin film has a crystal texture constituted of particles of a columnar structure.

Further preferably, the normal line of (001), being a specific crystal face, is oriented preferentially in a vertical direction to the substrate surface, and the angle formed by the normal line of the crystal face and the normal line of the substrate surface is set to be 3° or more.

Further preferably, the normal line of (111), being the specific crystal face, is oriented preferentially in the vertical direction to the substrate surface, and the angle formed by the normal line of the crystal face and the normal line of the substrate surface is set to be 1° or less.

Further preferably, the normal line of (001), being the specific crystal face, is oriented preferentially in the vertical direction to the substrate surface, and a deviation of the angle from a central value of the angle formed by the normal line of the crystal face and the normal line of the substrate surface is 1.2° or more.

Further preferably, the normal line of (001), being the specific crystal face, is oriented preferentially in the vertical direction to the substrate surface, and a width of a Debye ring of (001) in a pole figure measurement of the piezoelectric thin film element is 2.4° or more.

Further preferably, the normal line of (111), being the crystal face, is oriented preferentially in the vertical direction to the substrate surface, and the deviation of the angle from the central value of the angle formed by the normal line of the crystal face and the normal line of the substrate surface is 1° or more.

Further preferably, the normal line of (111), being the specific crystal face, is oriented preferentially in the vertical direction to the substrate surface, and the width of the Debye ring of (111) in the pole figure measurement of the piezoelectric thin film element is 2° or more.

Further, an underlayer can be provided between the substrate and the piezoelectric thin film. In this case, preferably the underlayer is an electrode layer of a lamination structure including a Pt layer or an alloy layer mainly composed of Pt, or an electrode layer mainly composed of Pt.

Further, an upper electrode can be formed on the piezoelectric thin film. In this case, preferably the uppper electrode layer is an electrode of a lamination structure including the Pt layer or the alloy layer mainly composed of Pt, or the electrode layer mainly composed of Pt.

Further preferably, a part of the piezoelectric thin film includes a crystal layer of $ABO_3$, an amorphous layer of $ABO_3$, or a mixed layer of the crystal and the amorphous of $ABO_3$, wherein A is an element of one kind or more selected from Li, Na, K, Pb, La, Sr, Nd, Ba, Bi, and B is an element of one kind or more selected from Zr, Ti, Mn, Mg, Nb, Sn, Sb, Ta, In, and O is oxygen.

Further preferably, a substrate is selected from any one of a Si substrate, a MgO substrate, a ZnO substrate, a $SrTiO_3$ substrate, a glass substrate, a quartz glass substrate, a GaAs substrate, a GaN substrate, a sapphire substrate, a Ge substrate, and a stainless substrate.

According to other aspect of the present invention, a piezoelectric thin film device is provided, including the aforementioned piezoelectric thin film element and a voltage application part or a voltage detection part.

According to the present invention, it is possible to provide the piezoelectric thin film element excellent in piezoelectric characteristics and productivity and the piezoelectric thin film device using the same.

BRIEF DESCRIPTION OF THE DRAWINGS

FIG. 5 shows a pole figure of the KNN piezoelectric thin film according to examples 1 and 2 of the present invention, wherein FIG. 5A is a stereographic projection view and FIG. 5B shows a graph in which the stereographic projection view is converted to an orthogonal coordinate.

FIG. 6 is a sectional view showing a concept of a highly oriented film of the KNN piezoelectric thin film element according to example 2 of the present invention, wherein FIG. 6A is a view showing the KNN thin film oriented preferentially in the same direction with respect to a substrate surface, and FIG. 6B is a view showing the KNN thin film oriented, with crystal grains having inclination (off), with respect to the substrate surface.

FIG. 9 shows the pole figure of the piezoelectric thin film according to example 4 of the present invention, wherein FIG. 9A is an orthogonal coordinate conversion graph of the pole figure when the inclination (off) angles of (001) preferentially oriented crystal grains with respect to the substrate surface are large; and FIG. 9B is an orthogonal coordinate conversion graph of the pole figure when the inclination (off) angles of (001) preferentially oriented crystal grains with respect to the substrate surface are small.

FIG. 10 shows the pole figure of the piezoelectric thin film according to example 5 of the present invention, wherein FIG. 10A is an orthogonal coordinate conversion graph of the pole figure when variation (deviation) of the inclination (off) angles of the (001) preferentially oriented crystal grains with respect to the substrate surface are large, and FIG. 10B is an orthogonal coordinate conversion graph when the variation (deviation) of the inclination (off) angles of the (001) preferentially oriented crystal angles with respect to the substrate surface are small.

FIG. 11 shows the pole figure of the piezoelectric thin film according to example 6 of the present invention, wherein FIG. 11A is an orthogonal coordinate conversion graph of the pole figure in a case of (001) preferential orientation with respect to the substrate surface, and FIG. 11B is an orthogonal coordinate conversion graph of the pole figure in a case of (111) preferential orientation with respect to the substrate surface.

FIG. 12 shows the pole figure of the piezoelectric thin film according to example 7 of the present invention, wherein FIG. 12A is an orthogonal coordinate conversion graph of the pole figure when the variation (deviation) of the inclination (off) angles of the crystal grains in a case of (001) and (111) preferential orientations with respect to the substrate surface are large, and FIG. 12B is an orthogonal coordinate conversion graph of the pole figure when the variation (deviation) of the inclination (off) angles of the crystal grains in a case of (001) and (111) preferential orientations are small.

Figure 1:
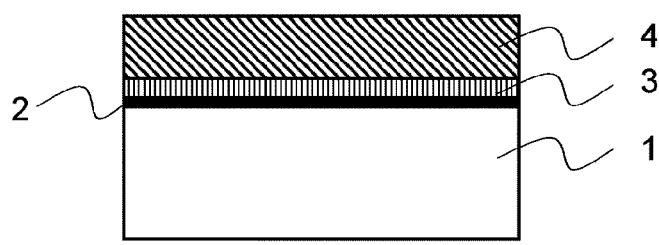
FIG. 1 is a sectional view of a piezoelectric thin film element using a piezoelectric thin film according to example 1 of the present invention.
Figure 2:
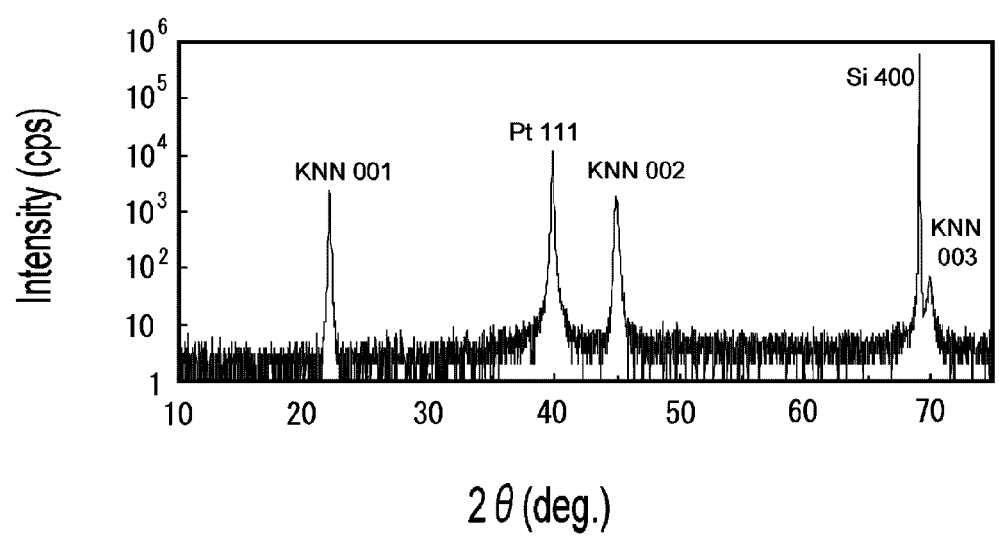
FIG. 2 is an example view of an X-ray diffraction pattern of 2θ/θ scan in the piezoelectric thin film element according to the example 1 of the present invention.

DESCRIPTION OF PREFERRED
EMBODIMENTS OF THE INVENTION

Preferred embodiments of a piezoelectric thin film element and a piezoelectric thin film device using the same according to the present invention will be described hereinafter.
(Outline of the Embodiments)

Inventors of the present invention have a knowledge that when a non-lead piezoelectric thin film element is manufactured, a piezoelectric element and a piezoelectric device having an excellent piezoelectric constant can be obtained, by performing quantitative and detailed management and control of the crystal orientation, which is not performed in a conventional technique, in film deposition of the piezoelectric thin film corresponding to a basic part of the piezoelectric element. The present invention is thereby achieved.

A high piezoelectric constant can not be obtained, unless crystal orientation of a piezoelectric thin film is managed and controlled, and the crystal orientation is varied at different lots, or even in the same lot, at different parts where the element is obtained, resulting in a non-uniform piezoelectric constant in each obtained element. According to an embodiment of the present invention, by appropriately selecting constitutional materials of an electrode and the piezoelectric thin film, etc, then controlling manufacturing conditions of the electrode and the piezoelectric thin film, etc, and defining an angle formed by the crystal orientation direction of the piezoelectric thin film and a normal line of the substrate surface, or deviation thereof so as to fall within a prescribed range, the piezoelectric constant is improved, and the piezoelectric thin film element having high piezoelectric characteristics and a piezoelectric thin film device having high performance can be realized.
(Basic Structure of the Piezoelectric Element)

The piezoelectric thin film element according to this embodiment has a substrate and an oxide film formed on a surface of the substrate; a lower electrode layer formed on the oxide film; and a piezoelectric thin film formed on the lower electrode layer.

This piezoelectric thin film is an $ABO_3$ oxide having a perovskite structure, wherein A is composed of at least one element selected from a group consisting of Li, Na, K, Pb, La, Sr, Nd, Ba, and Bi, and B is composed of at least one element selected from a group consisting of Zr, Ti, Mn, Mg, Nb, Sn, Sb, Ta, and In, and O is oxygen, as compositions thereof. Pb can also be used as one of the aforementioned A (piezoelectric material). However, the piezoelectric thin film not containing Pb is desire from an aspect of environment.

As the substrate, a Si substrate, a MgO substrate, a ZnO substrate, a $SrTiO_3$ substrate, a glass substrate, a quartz glass substrate, a GaAs substrate, a GaN substrate, a sapphire substrate, a Ge substrate, and a stainless substrate, etc, can be given. Particularly, the Si substrate produced at a low cost and having industrial achievement is desirable.

As the oxide film formed on the surface of the substrate, a thermal oxide film formed by thermal oxidation and a Si oxide film formed by a CVD (Chemical Vapor Deposition) method can be given. Note that the lower electrode may be formed directly on the oxide substrate such as a quartz glass ($SiO_2$), MgO, $SrTiO_3$, $SrRuO_3$ substrates without forming the oxide film.

The lower electrode layer is desirably an electrode layer including Pt or an alloy mainly composed of Pt, or including the electrode layer mainly composed of Pt. Further, the lower electrode layer is preferably formed so as to be oriented in (111) plane.

A bonding layer for increasing adhesion to the substrate may also be provided between the substrate and the electrode layer including Pt or the alloy mainly composed of Pt.

As the $ABO_3$ oxide, being the piezoelectric thin film, particularly potassium sodium niobate and lithium potassium sodium niobate (called LKNN hereinafter), and a piezoelectric thin film with a perovskite oxide as a main phase expressed by a general formula $(Na_xK_yLi_z)NbO_3$ ($0 \leq x \leq 1$, $0 \leq y \leq 1$, $0 \leq z \leq 0.2$, $x+y+z=1$) are preferable. The LKNN thin film may be doped with a prescribed amount of Ta and V. The piezoelectric thin film is formed by using a RF sputtering method, an ion beam sputtering method, or a CVD method. The LKNN film formed by these methods has an crystal texture constituted of particles of a columnar structure. The RF sputtering method is used in this embodiment.
(Crystal Orientation of the Lower Electrode Layer)

Incidentally, as conventional, when a Pt lower electrode is formed on the Si substrate without considering a surface shape and the crystal orientation, or with consideration of the crystal orientation but without controlling it with high precision, the crystal orientation of the LKNN thin film (including the potassium sodium niobate (called KNN hereinafter) film) is set in a random orientation state in many cases. Further, the orientation direction of each crystal grain of the LKNN thin film with respect to the normal line of the Si substrate surface is different in many cases in each substrate or depending on a film deposition part. Namely, conventionally an influence of the crystal orientation, being one of characteristic decision factors of the piezoelectric thin film is ignored to manufacture the piezoelectric material. Therefore, there is a problem that as piezoelectric characteristics of the LKNN thin film, a highly desired piezoelectric constant can not be obtained, and the LKNN thin film having different piezoelectric characteristics is formed in each element.

Actually, the crystal orientation of the LKNN thin film is different in the film forming (film deposition) part or in each production lot. This is because the crystal orientation and the surface shape of the lower electrode layer corresponding to a base of the piezoelectric thin film can not be stably secured, and an initial state of crystal growth of the thin film can not be controlled, thus making it difficult to stably cause the crystal growth of the piezoelectric thin film to be formed thereon. For example, in a case of a Pt electrode, crystallinity of the same (111) preferential orientation can not be manufactured with good reproduction, and therefore, when sputtering film deposition is performed by heating at 400° C., random grown of the individual crystal grain of LKNN is confirmed. Further, by increasing applied electric power during film deposition by sputtering, a plurality of sputter particles are forcibly driven onto the substrate in a given direction, by an impact of energy particles such as Ar and ion. As a result, the piezoelectric thin film of polycrystalline grains inclined largely with respect to the normal line direction of the substrate surface is formed, resulting in a large difference between an easily polarizing direction and an application voltage direction. As a result, it is found that lowering of the piezoelectric constant is induced, and further a knowledge that the crystal orientation can be controlled if a film forming temperature, film forming gas, and power are optimized, is obtained.

(Control of the Crystal Orientation According to an Embodiment)

Based on the aforementioned knowledge, according to this embodiment, crystal orientations of the Pt thin film and the piezoelectric thin film were controlled.

(Crystal Orientation of the Pt Thin Film)

First, the film forming temperature and film forming gas of the Pt thin film were optimized, for stably realizing the crystallinity of the Pt thin film of the lower electrode corresponding to the base of the LKNN thin film.

Study on the film forming temperature is recommended as the film forming condition, and it is found that a film forming range of 100 to 500° C. falls within an optimal temperature range as the condition of the (111) preferential orientation.

Further, in order to improve smoothness of the Pt surface, Ti layer with smooth surface of 0.1 nm to several nm was formed to improve uniformity of the Ti layer, being an adhesion layer adhesive to the substrate, and the Pt electrode was formed thereon, to thereby reduce and control a surface roughness of the Pt lower electrode to a size of several nm.

Further, the surface roughness of the Pt lower electrode layer is reduced by precisely controlling a film thickness of the Pt lower electrode layer, thus making it possible to form the Pt lower electrode layer by controlling the sizes of the crystal grains of the lower electrode layer to be uniform.

Note that the lower electrode layer may be the electrode layer of a lamination structure containing not only Pt but also the alloy mainly composed of Pt, or including an electrode layer mainly composed of Pt. Further, the lower electrode layer may also be an electrode layer of a lamination structure containing Ru, Ir, Sn, In and an oxide of each of them, or including a layer of a compound with an element contained in the piezoelectric thin film. In these cases also, in the same way as the case of the Pt thin film, the crystallinity of the lower electrode thin film corresponding to the base of the LKNN thin film can be stably realized, by optimizing the film forming temperature and the film forming gas.

Further, as candidates of the substrate that form the lower electrode thin film, crystal or amorphous material such as MgO, Si, Ge, $Al_2O_3$, $SrTiO_3$, and quartz, or a complex of them is desirable. Regarding the element, with the adhesion layer and the lower electrode layer formed on the substrates thereof and the LKNN thin film formed thereon, the crystal orientation of the LKNN thin film was compared in detail, and actually selection of the substrate capable of controlling the preferential orientation is performed. As a result, it is found that as the substrate, the Si substrate is preferable, because the Si substrate is produced at a low cost and has an industrial achievement.

(Crystal Orientation of the Piezoelectric Thin Film)

Further, in order to further surely realize the preferential orientation of the LKNN thin film, in the above-described embodiment, the preferential orientation of the LKNN thin film may be achieved, by optimizing a film depositing temperature of the LKNN thin film itself, the kind and a pressure of a sputtering operation gas, degree of vacuum, and supplied electric power. By studying various aspects of these conditions in each apparatus and in accordance with an environment, it becomes possible to form the LKNN thin film of a pseudo-cubic crystal with good reproducibility, which is preferentially oriented in (001) and (111) or preferentially oriented in which both of them coexist.

Further, a manufacturing condition for reducing a warpage amount of the LKNN thin film may be examined.

Therefore, next, in order to strictly control the preferential orientation of the LKNN thin film itself of polycrystal or epitaxially-grown single crystal, a distance between a sputtering target and the substrate is strictly set always to a fixed value, so that an inclination angle of a preferentially oriented crystal face falls within a specified range.

Further, a deviation amount between the center of the sputtering target and the center of the substrate is set, so as to fall within a specified range.

Based on the aforementioned conditions, the applied electric power for sputtering and a pressure of operation gas and a magnitude of gas flow rate for film deposition are decided to be optimal values.

Thus, the inclination angle of the preferentially oriented crystal face can be surely controlled, and the LKNN thin film showing a high piezoelectric constant can be obtained.

Further, density of the sputtering target can also be expected to exhibit similar effects by being varied in accordance with the aforementioned circumstance.

Preferably, the LKNN thin film has a crystal structure of any one of a pseudo-cubic crystal, a tetragonal crystal, or an orthorhombic crystal, or has a crystal structure of coexistence of them. Excellent piezoelectric characteristics can be realized by these structures.

Two or less axes of these crystal axes are preferentially oriented in a certain specific axial direction.

In addition, preferably the piezoelectric thin film is formed on the lower electrode so that an angle formed by at least one crystal axis of the oriented crystal axes and the normal line of the substrate surface falls within a range of 0° to 10°, to realize extremely excellent piezoelectric characteristics. The angle formed by the substrate surface and the normal line is set to 0°, because 0° is a reference. Angle 10° formed by the substrate surface and the normal line is set as an upper limit. This is because the preferential orientation is not obtained if the angle is beyond 10°. The embodiments of forming the piezoelectric thin film on the lower electrode within the aforementioned angle range are as follows (1) to (4).

(1) The normal line of (001), being a specific crystal face, is oriented preferentially in a vertical direction with respect to the substrate surface, and the angle formed by the normal line of the crystal face and the normal line of the substrate surface is 3° or more.

(2) The normal line of (111), being a specific crystal face, is oriented preferentially in the vertical direction with respect to the substrate surface, and the angle formed by the normal line of the crystal face and the normal line of the substrate surface is 1° or less.

(3) The normal line of (001), being a specific crystal face, is oriented preferentially in the vertical direction with respect to the substrate surface, and the deviation of this angle is 2.4° or more from a central value of the angle formed by the normal line of the crystal face and the normal line of the substrate surface.

(4) The normal line of (111), being a specific crystal face, is oriented preferentially in the vertical direction with respect to the substrate surface, and the deviation of this angle is 2° or more from the central value of the angle formed by the normal line of the crystal face and the normal line of the substrate surface.

The structure of the LKNN film preferentially oriented in the specific axial direction may be a structure having one of (001) preferentially oriented crystal grains, (110) preferentially oriented crystal grains, and (111) preferentially oriented crystal grains, or may be a structure in which two or more of them coexist.

(Piezoelectric Thin Film Device)

Regarding the substrate with the piezoelectric thin film according to this embodiment, the piezoelectric thin film element showing a high piezoelectric constant can be manufactured by forming the upper electrode layer on an upper part of the piezoelectric thin film. The piezoelectric thin film device such as each kind of actuator and sensor can be manufactured by molding this piezoelectric thin film element into a prescribed shape and providing a voltage application part and a voltage detection part.

Figure 19:
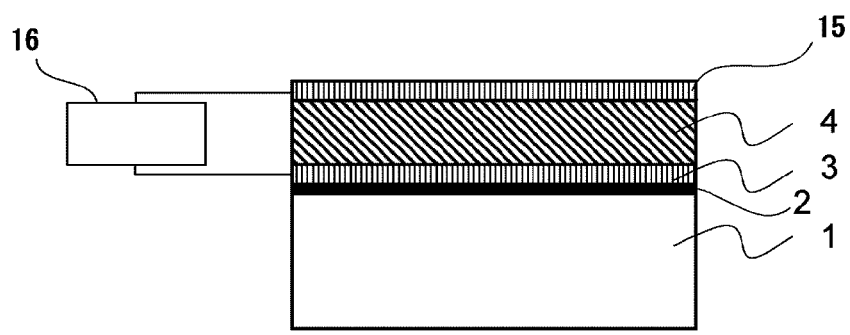
FIG. 19 is a schematic block diagram of a piezoelectric thin film device according to an embodiment of the present invention.

FIG. 19 shows an example of the piezoelectric thin film device including the voltage application part and the voltage detection part. This piezoelectric thin film device includes the piezoelectric thin film element constituted in a lamination of a lower electrode 3, a piezoelectric thin film 4, and an upper electrode 15 on a substrate 1; and a voltage application part or a voltage detection part 16 to which the lower electrode 3 and the upper electrode 15 are electrically connected.

(Upper Electrode)

Preferably, in the same way as the lower electrode layer, the upper electrode layer formed on the upper part of the piezoelectric thin film has a lamination structure including Pt or the alloy mainly composed of Pt, or including the electrode layer mainly composed of Pt. Alternatively, the upper electrode layer may be an electrode layer of a lamination structure including Ru, Ir, Sn, In and an oxide of them, and a layer of a compound with an element contained in a piezoelectric thin film.

(Effects of the Embodiments)

According to the present invention, one or more effects as described below are exhibited.

According to one or more embodiments of the present invention, the piezoelectric thin film element having excellent piezoelectric characteristics and the piezoelectric thin film device using the same can be provided, by controlling the crystal orientation of the piezoelectric thin film and defining the angle formed by the crystal orientation and the normal line of the substrate surface to fall within a prescribed range. Further, a non-lead device having long service life and high piezoelectric constant can be stably produced. Also, the crystal orientation can be made uniform without being varied at different film deposition parts, and variation of the piezoelectric constants of the piezoelectric thin film formed on the substrate can be suppressed. Therefore, a production yield can be improved.

According to one or more embodiments of the present invention, in the piezoelectric thin film element having a lamination structure of the substrate, the lower electrode, the piezoelectric thin film, and the upper electrode, the piezoelectric thin film has a preferentially oriented crystal structure. Then, the angle formed by an orientation axis thereof and the normal line of the substrate surface is controlled to fall within the range of 0° to 10°, or a deflection angle of the orientation axis is controlled to 3° or more, and a specific preferential orientation axis different from the aforementioned orientation axis is controlled to 1° or less, to thereby prevent the decrease of the piezoelectric constant due to random crystal orientation.

Further, according to one or more embodiments of the present invention, the crystal orientation of the piezoelectric thin film formed on the upper part of the lower electrode can be controlled by controlling the Pt electrode, or Pt alloy as the lower electrode, and others such as Ru, Ir and the oxide of them and Pt as the lower electrode, and a compound with the element contained in the piezoelectric thin film, to the preferential orientation.

Further, according to one or more embodiments of the present invention, regarding the substrate, by using the MgO substrate, SrTiO$_3$ substrate, glass substrate, quartz glass substrate, GaAs substrate, sapphire substrate, Ge substrate, and stainless substrate, etc, other than Si, the crystal orientation of the piezoelectric thin film formed on the substrate can be controlled. Thus, the piezoelectric characteristics can be further improved.

Further, according to one or more embodiments of the present invention, the piezoelectric thin film device such as each kind of actuator and sensor can be manufactured by forming the piezoelectric thin film element of this embodiment into a prescribed shape, and providing the voltage application part and the voltage detection part. By precisely controlling the crystal orientation of the thin film, the piezoelectric characteristics of the piezoelectric thin film element and the device can be improved, and the variation of the piezoelectric characteristics can be prevented. Thus, a micro device having high performance can be provided at a low cost.

Further, according to one or more embodiments of the present invention, the piezoelectric thin film having excellent piezoelectric characteristics can be realized, and the piezoelectric thin film element having high performance can be obtained with high production yield. Further, such a piezoelectric thin film element is the one having the thin film not using lead. Accordingly, by mounting the aforementioned piezoelectric thin film element, an environmental load can be reduced, and a small-sized system apparatus such as a small-sized motor, sensor, and actuator having high performance, for example, MEMS (Micro electro Mechanical System) can be realized. Further, the aforementioned piezoelectric thin film can be applied to a filter device such as a surface acoustic wave device including a piezoelectric thin film formed on a substrate and an electrode formed on the piezoelectric thin film.

EXAMPLES

Next, examples of the present invention will be described.

Example 1

Example 1 will be described using FIG. 1 to FIG. 5.

FIG. 1 shows a schematic sectional view of a substrate with a piezoelectric thin film. In this example, the piezoelectric thin film element was manufactured by forming the lower electrode layer 3 and the piezoelectric thin film 4 of potassium sodium niobate having the perovskite structure on the upper part where the bonding layer 2 was formed on the Si substrate 1 having the oxide film. At that time, a crystal orientation state of the piezoelectric thin film was varied depending on manufacturing conditions. A manufacturing method of the piezoelectric thin film element will be described in detail.

First, the thermal oxide film was formed on the surface of the Si substrate, and the lower electrode layer 3 was formed thereon. The lower electrode layer 3 is composed of a Ti film having thickness of 2 nm formed as a bonding layer 2 and a Pt thin film having thickness of 200 nm formed on the Ti film as the electrode layer. The sputtering method was used in forming the Pt lower electrode layer 3. A Pt metal target was used as a sputtering target, and the applied electric power for sputtering during film deposition was set to 75 W, and 100% Ar gas was used as sputtering gas. Further, during film deposition, a substrate temperature was set to 300° C., to thereby form the Pt thin film, being a polycrystal thin film.

Next, the KNN thin film was formed on the Pt lower electrode layer 3 as a piezoelectric thin film 4. The sputtering method was used to form the KNN thin film. The substrate was heated during formation of the KNN thin film, and sputtering was applied thereto by plasma using a mixed gas of Ar+$O_2$. A mixing ratio was set to 9:1. A sintered compact target of (NaxKyLiz)Nb$O_3$, x=0.5, y=0.5, Z=0 was used as a target. The film deposition was performed until the film thickness was set to 3 μm.

Figure 3:
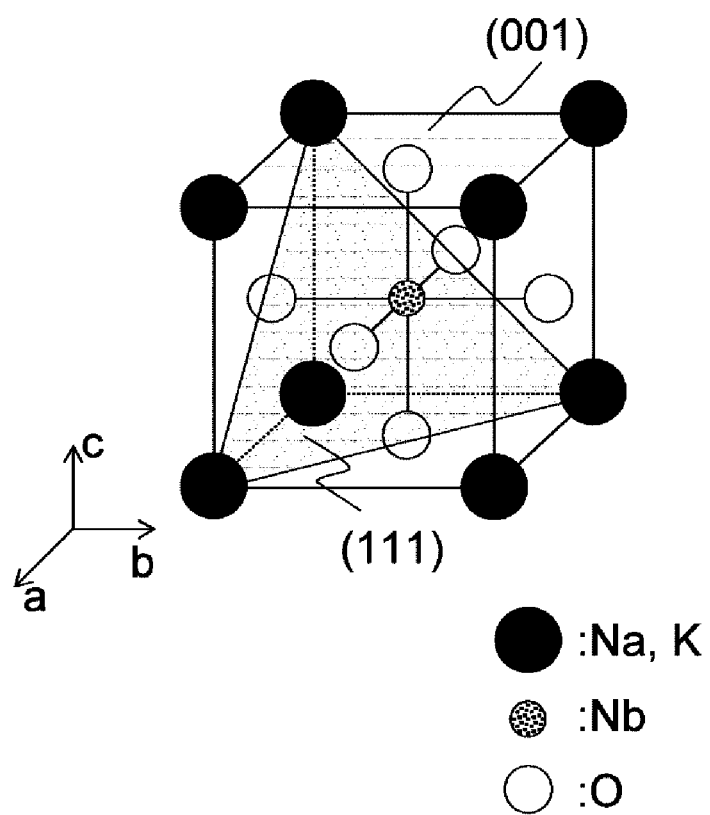
FIG. 3 is a view showing a crystal structure of KNN piezoelectric thin film according to the example 1 of the present invention.

Regarding the KNN thin film thus manufactured, a crystal structure was examined by a general X-ray diffractometer. As a result, it was found that as shown in an X-ray diffraction pattern (2θ/θ scan measurement), the thin film oriented in (111) plane in the vertical direction to the substrate surface was formed in the Pt thin film according to example 1 which was formed by heating the substrate. As a result of forming the KNN thin film on the Pt thin film preferentially oriented in the (111) plane, it was found that the manufactured KNN thin film was the polycrystal thin film having the perovskite crystal structure of the pseudo-cubic crystal as shown in FIG. 3. Further, as is clarified from the X-ray diffraction pattern of FIG. 2, only the diffraction peak of (001) plane, (002) plane, and (003) plane could be confirmed, and therefore it was found that the KNN piezoelectric thin film was preferentially oriented in (001) plane.

In this embodiment 1, regarding the KNN piezoelectric thin film whose crystal orientation was intentionally controlled, measurement of the pole figure was performed to evaluate the orientation of the KNN thin film in detail. The pole figure is a stereographic projection view of a spread of the pole in a certain specific lattice plane, thereby making it possible to evaluate the orientation state of polycrystal in detail. See document 1 for details, (Revised No.4 version of Introduction to X-ray diffraction edited by Rigaku Corporation, 1986), and document 2 (New version of Elements of X-ray diffraction written by B. D. Cullity (Agne, 1980).

The definition of the preferential orientation can be clarified by the measurement of the pole figure. Regarding a polycrystal substance (including the thin film), when the individual crystal grain is set in a state of the "preferential orientation" in a certain fixed direction, a local distribution of X-ray reflection, such as spot-like or ring-shaped Debye rings at specific angle positions, can be inevitably found out in the measurement of the pole figure of this substance. Meanwhile, when the individual crystal grain of the substance is set in an arbitrary direction, in other words, when it is set in a "random direction", the spot-like or ring-shaped X-ray reflection can not be found out in the pole figure.

Whether or not the piezoelectric thin film is preferentially oriented is judged by presence/absence of the X-ray reflection, and presence of the preferential orientation is defined by this X-ray reflection. In a structure analysis in the piezoelectric element of example 1, "D8 DISCOVER with Hi STAR, VANTEC2000" by BukerAxs Corporation, was used, which was a high output X-ray diffractometer and on which a two-dimensional detector was mounted, having an X-ray detection area of a large area. In this example, the pole figure, with (110) plane of the KNN thin film as a pole, was measured.

Figure 4:
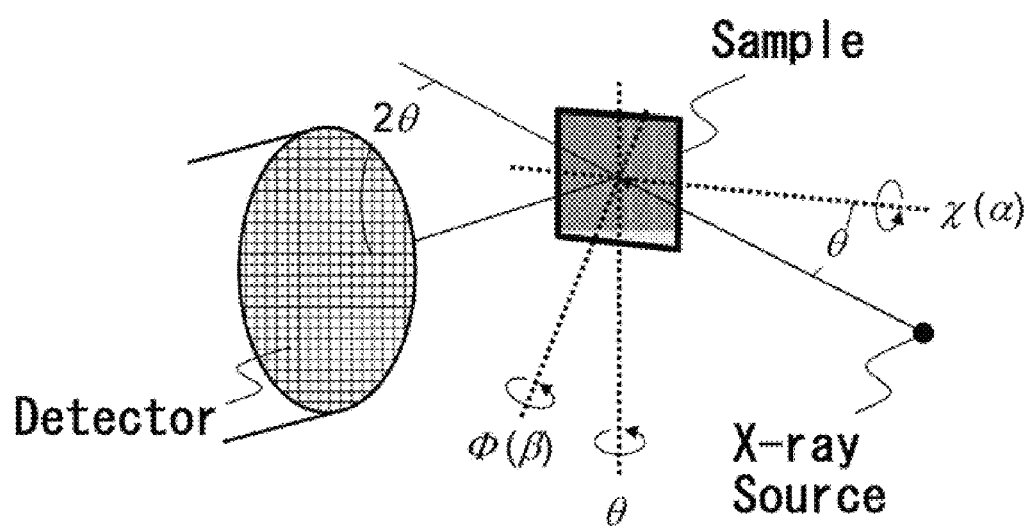
FIG. 4 is an experiment arrangement view in a pole figure measurement of a KNN piezoelectric thin film according to the examples 1 of the present invention.

FIG. 4 is a conceptual view of a measurement arrangement of the pole figure performed in this example. This is a method called a reflection method of Schultz. In a conventional pole figure measurement, the used X-ray detector shows 0-th order in many cases. Therefore, X(α) axis and Φ(β) axis shown in FIG. 4 need to be simultaneously scanned, thus requiring a long time in measurement. However, in this example, a 2D X-ray detector (Hi STAR, VANTECH2000) of a large area was used, thus requiring almost no scan of the two axes and making it possible to perform measurement for a short time. Therefore, large volume of analysis results of the crystal orientation of the KNN thin film manufactured under various conditions can be obtained speedily. This makes it possible to realize the KNN piezoelectric thin film having the crystal structure of the present invention.

Figure 5:
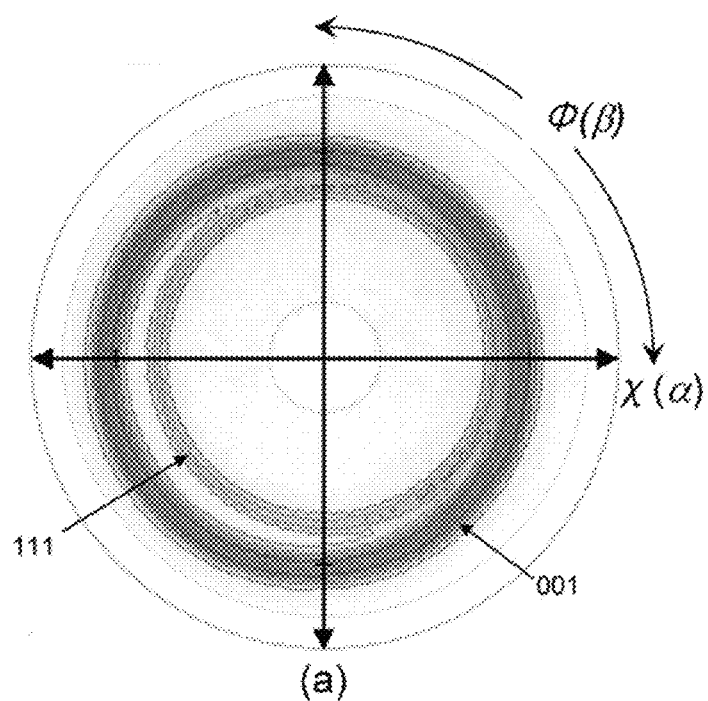
Figure 5:
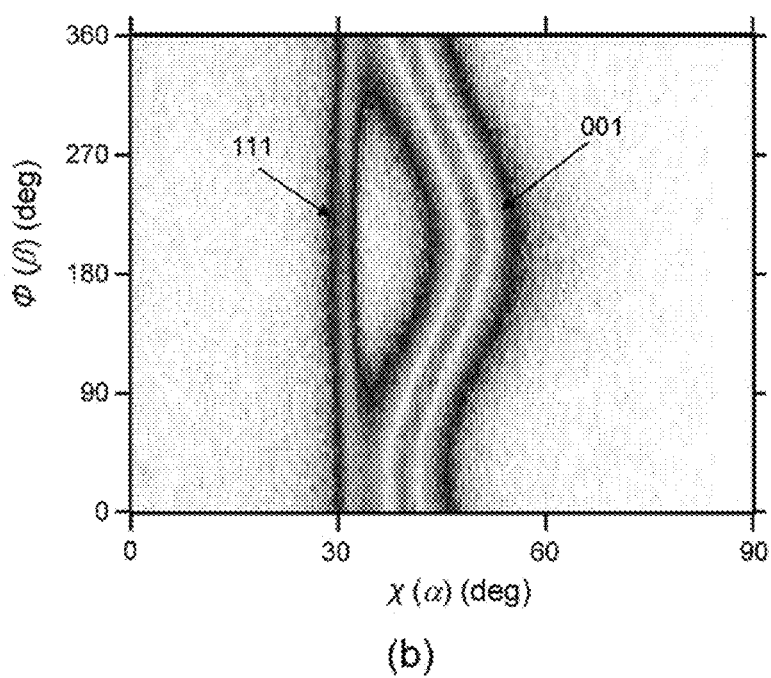

FIG. 5 shows the measurement result of the pole figure of the piezoelectric thin film according to example 1. As shown in FIG. 5A, being the pole figure, Debye ring corresponding to the diffraction surface of (001) was observed in the vicinity of angle 45° from the center along the vertical axis and the horizontal axis. Meanwhile, Debye ring corresponding to the diffraction surface of (111) was found out in the vicinity of 35.3°. It is found that each Debye ring is deviated from the arrangement of a concentric circle, and is eccentric slightly from the center. Next, in order to quantitatively compare the state of eccentricity of the Debye rings, the pole figure of this example is shown again in a graph in which regarding an axis (X(α) axis) in a radial direction and an axis (Φ(β) axis) in a circumferential direction, the X-axis is set as the horizontal axis and the Φ-axis is set as the vertical axis. As shown in FIG. 5, in a profile obtained here, the angle of eccentricity is shown by amplitude of its waveform on the X-axis, which corresponds to twice the angle formed by the normal line direction with respect to the substrate surface and the normal line of the crystal face. By performing fitting analysis using least-squares, to the obtained waveform data, the amplitude of the waveform data can be obtained, and as a result, the off angle (inclined angle) of each crystal grain, which is preferentially oriented in the normal line direction of the substrate surface, can be estimated. As the amplitude is greater, the off angle of each preferentially oriented crystal grain becomes greater, and reversely as the amplitude is smaller, the off angle becomes smaller. Particularly, in a case of a straight line parallel to the Φ-axis, this graph shows that there is no off angle.

Example 2 will be described by using FIG. 5, FIG. 6, FIG. 7, and FIG. 18.

Figure 6:
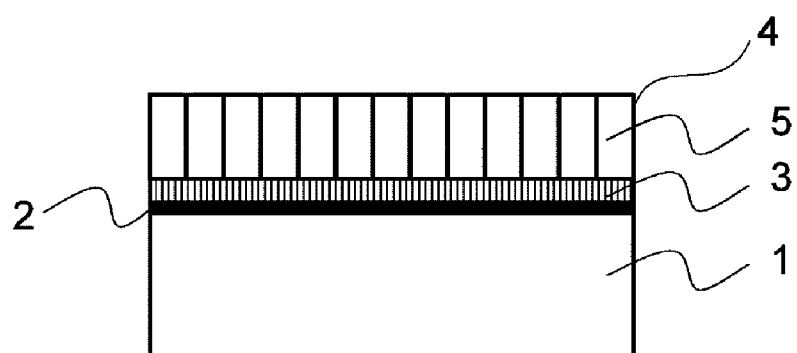
Figure 6:
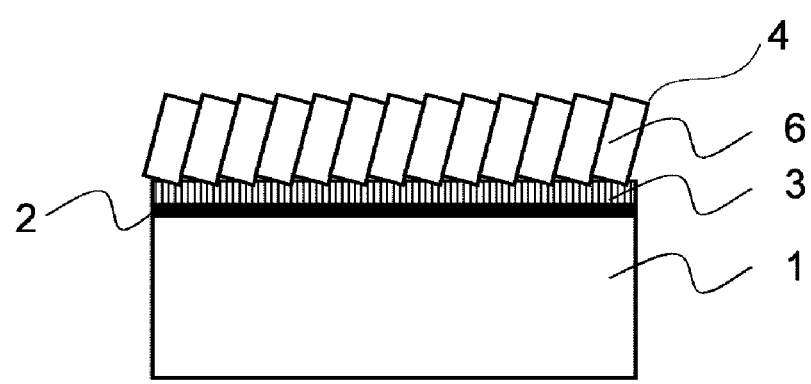
Figure 18:
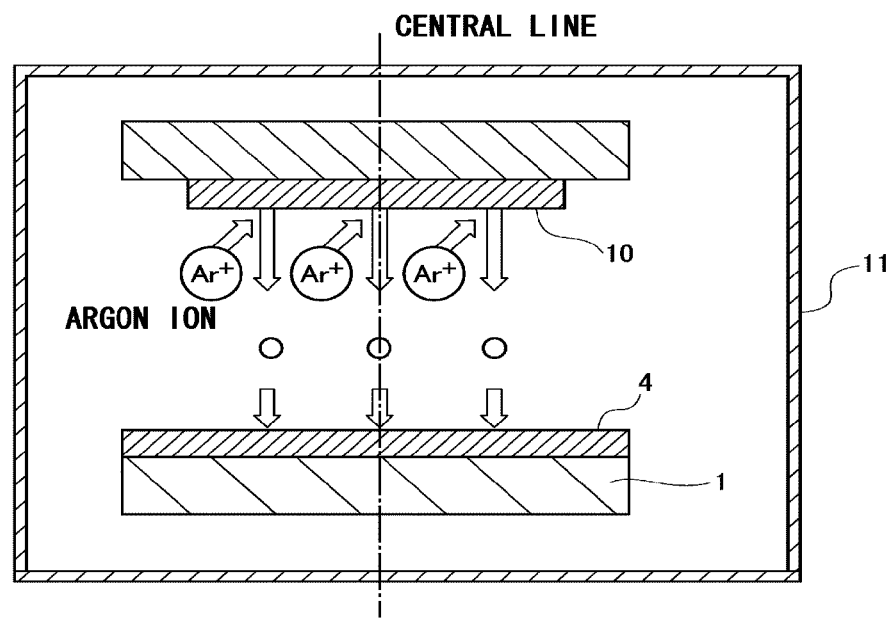
FIG. 18 is a schematic block diagram of an RF sputtering apparatus for manufacturing the piezoelectric thin film element using the piezoelectric thin film according to example 2 of the present invention.

In the example 2, regarding the example 1, manufacture of the preferentially oriented KNN thin film was tried. Its sectional schematic view is shown in FIG. 6 as the example 2. Further, a schematic view of the RF sputtering apparatus for manufacturing the KNN thin film is shown in FIG. 18.

First, in the example 2, the applied electric power of the RF sputtering apparatus was set to 100 W, and the center of the sputtering target 10 and the center of the substrate 1 were made to coincide with each other (FIG. 18), and thereafter the KNN piezoelectric thin film 4 was formed and the piezoelectric thin film element was manufactured.

FIG. 6A shows an example of the piezoelectric thin film element manufactured as described above as a sectional schematic view. The piezoelectric thin film element was manufactured, in which the lower electrode layer 3 and the piezoelectric thin film 4 of KNN having the perovskite structure was manufactured on the upper part where the bonding layer 2 was formed on the Si substrate 1 having the oxide film. Here, the polycrystal piezoelectric thin film 4 has an crystal texture in which the crystal grains 5, each having a columnar structure, are arranged in approximately a given direction.

From the manufactured piezoelectric thin film element, it was confirmed that the normal line direction of the crystal face of the preferentially oriented crystal grains 5 was preferentially oriented in the same direction as the normal line direction of the substrate 1 surface. Namely, it becomes possible to manufacture the polycrystal piezoelectric thin film in which the normal line of the (001) crystal face approximately coincides with the normal line direction of the surface of the substrate 1.

At this time, in the measurement of the pole figure, no eccentricity was found out in the Debye rings of (001) and (111) as shown in FIG. 5A, and the Debye rings were plotted so as to be concentrically arranged. Further, when the X-axis and the Φ-axis of the stereographic projection view were converted to the graph in which the x-y axes are orthogonal axes, a waveform curve as shown in FIG. 5B can not be found and (001) and (111) are formed in a linear state.

Next, in the example 2, the applied electric power was set to 100 W, and the film deposition was performed, with the center of the substrate 1 shifted by several cm from the center of the sputter target 10. In this case, as shown in FIG. 6B, it was confirmed that the normal line directions of the crystal faces of the preferentially oriented crystal grains 6 were slightly deviated from the normal line direction of the surface of the substrate 1 and the crystal grains 6 are inclined.

In the example 2, as shown in FIG. 5A, two Debye rings of (001) and (111) were'observed, and as shown in FIG. 5B, it was found that the amplitude of each waveform curve was different. This shows that the off angle with respect to the substrate surface of each crystal face of (001) and (111) is different. At this time, an analysis value of the amplitude of (001) was 9.9°. Meanwhile, the analysis value of the amplitude of (111) was 0.52°. As a result, it was found that in the piezoelectric thin film of the example 2, an inclination angle of (001) in a crystal orientation direction was about 5°, and an inclination angle of (111) in the crystal orientation direction was about 0.3°.

Figure 7:
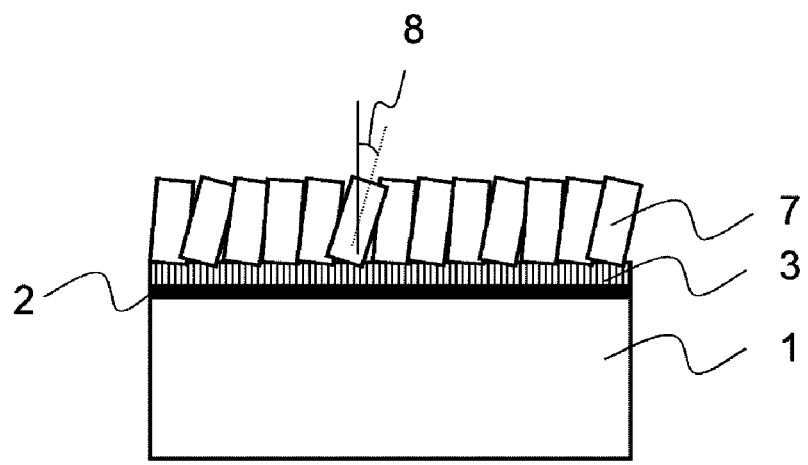
FIG. 7 is a sectional view showing that there is a variation (deviation) in inclination angles (off) of the crystal grains with respect to the substrate surface of a preferentially oriented KNN piezoelectric thin film according to the example 2 of the present invention.

Thus, in the example 2, although the manufacture of the preferentially oriented KNN thin film was tried, each preferentially oriented crystal grain 6 has slightly different inclination angle in many cases. Namely, there is a variation in the crystal grains. FIG. 7 is a sectional conceptual view of the piezoelectric thin film element. The variation (deviation) of the crystal grains 7 having different inclination angles substantially reflect sizes of the widths of the Debye rings shown in FIG. 5. Accordingly, by measuring the widths of the Debye rings, the magnitude of the variation of the off angles with respect to the substrate of the piezoelectric thin film can be estimated.

Example 3

Example 3 will be described using FIG. 8.

Figure 8:
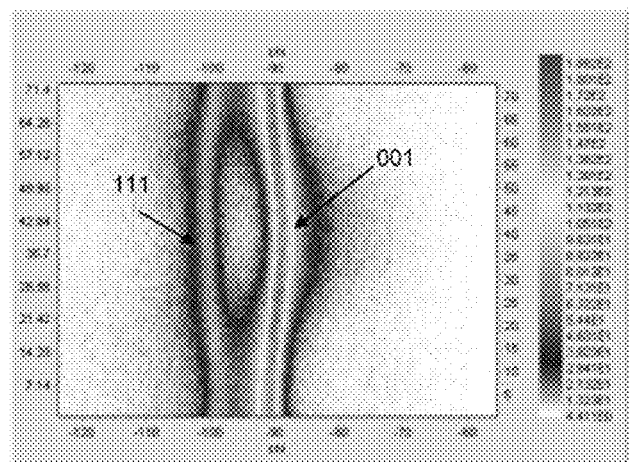
FIG. 8A to FIG. 8C show graphs in which the inclination (off) angles of crystal grains and its variation (deviation) are varied, with respect to the substrate surface according to example 3 of the present invention.
Figure 8:
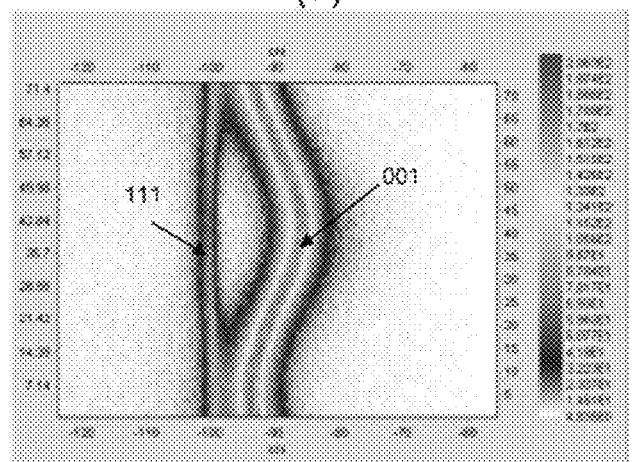
Figure 8:
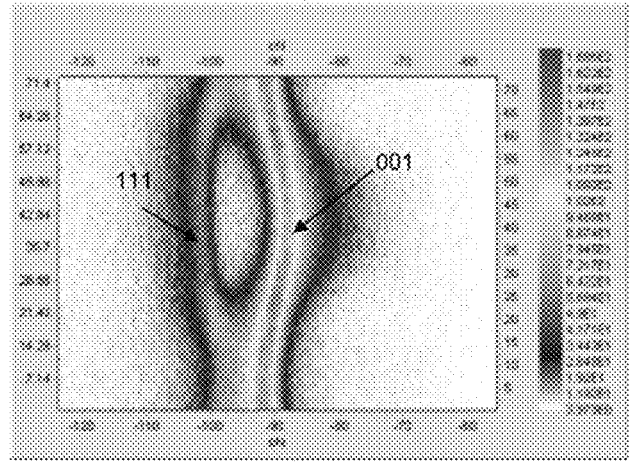

As the example 3, FIG. 8 shows a measurement result of the pole figure of the piezoelectric thin film manufactured by varying the variation of the inclination (off) angles. When the film forming conditions such as the crystal orientation of the Pt lower electrode and the applied electric power for the film deposition of the KNN piezoelectric thin film by sputtering are varied, or when the film forming conditions are not strictly managed, it is clarified that various crystal orientations are shown and the waveform of the Debye rings corresponding to (001) and (111) are variously changed.

In FIG. 8A, amplitudes of both (001) and (111) are small and the off angles with respect to the substrate are small. Also, it is clarified that the widths of the Debye rings are small, and the KNN thin film is formed, with small off angles and variation with respect to the substrate of the piezoelectric thin film.

In FIG. 8B, the amplitude of (001) is great, and the off angle of the KNN thin film preferentially oriented in (001) with respect to the substrate of the KNN thin film is great. However, the amplitude of (111) is smaller than the amplitude of (001), and the off angle of the KNN thin film preferentially oriented in (111) with respect to the substrate is smaller than that of the crystal oriented preferentially in (001).

Further, in FIG. 8C, it is found that the widths of the Debye rings corresponding to (001) and (111) are greater than those shown in FIG. 8A and FIG. 8B, and the variation of the off angles of the piezoelectric thin film with respect to the substrate is great.

As described above, when the pole figure measurement is performed, the difference in crystal orientations of the KNN piezoelectric thin film can be examined in detail.

Example 4

Example 4 will be described using FIG. 9.

Figure 9:
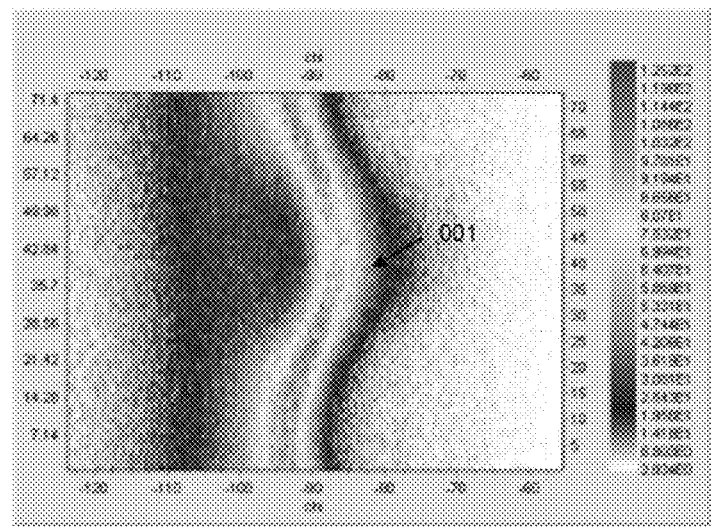
Figure 9:
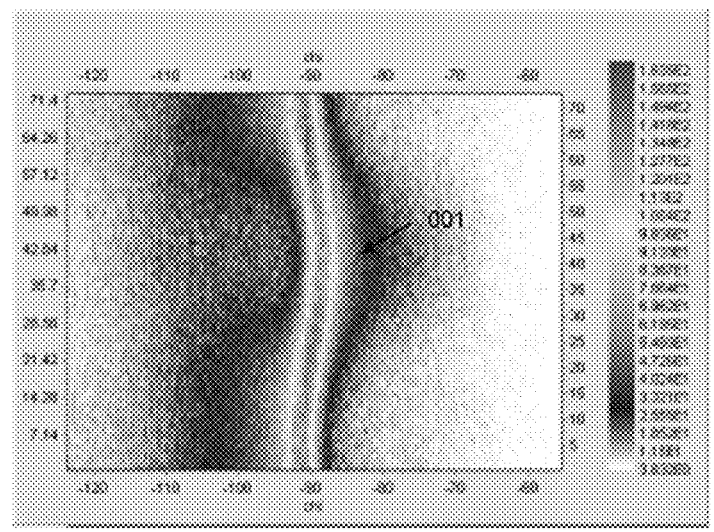

As the example 4, FIG. 9 shows a result of the pole figure measurement of the KNN piezoelectric thin film formed on the Pt lower electrode set in a low orientation state, with sputtering applied electric power varied. In FIG. 9, the inclination (off) angles are varied in accordance with the sputtering applied electric power.

FIG. 9A shows the pole figure of the KNN thin film when the film deposition is performed, with the sputtering applied electric power set to 60 W, and FIG. 9B shows the pole figure of the KNN thin film when the film deposition is performed, with the sputtering applied electric power set to 65 W. When FIG. 9A and FIG. 9B are compared, the amplitude of the Debye ring of (001) of the KNN thin film formed with applied electric power set to 60 W shown in FIG. 9A is greater than the amplitude when the film deposition is performed with the applied electric power set to 65 W as shown in FIG. 9B. Namely, when the KNN thin film is formed on the Pt lower electrode, with the sputtering applied electric power set to small, the off angles of the crystal grains oriented preferentially in (001) are great.

Example 5

Example 5 will be described using FIG. 10.

Figure 10:
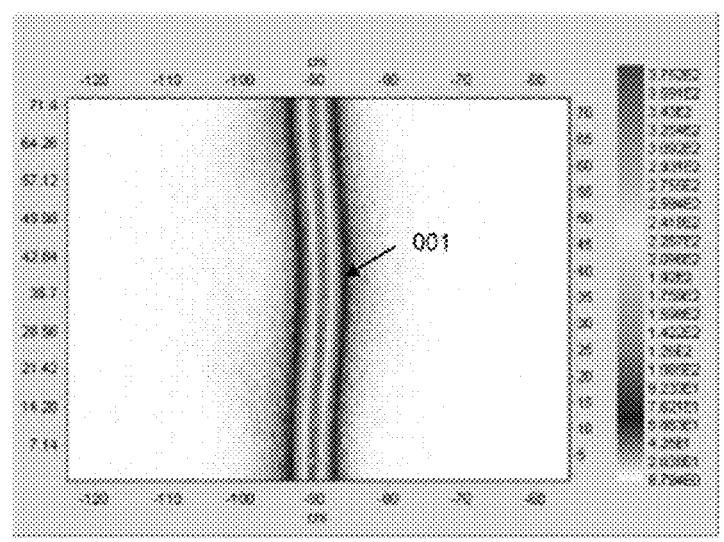
Figure 10:
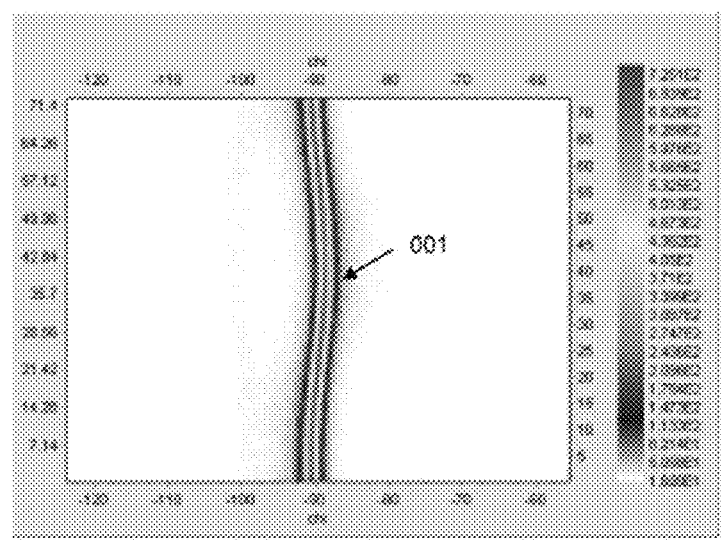

As the example 5, FIG. 10 shows a result of the pole figure measurement of the KNN piezoelectric thin film manufactured by varying the variation (deviation) of the inclination (off) angles with respect to the substrate, for the (001) preferentially oriented crystal grains.

At this time, FIG. 10A shows a result of a case of performing film deposition with the sputtering applied electric power set to 75 W, and FIG. 10B shows a result of a case of performing film deposition with the sputtering applied electric power set to 60 W, on the (111) highly oriented Pt electrode. When FIG. 10A and FIG. 10B are compared, it is found that the size of the amplitude is the same. Namely, the inclination (off) angles of the (001) preferentially oriented crystal grains with respect to the substrate are same. Meanwhile, it is found that the widths of the Debye rings shown in FIG. 10A are greater. Namely, when the KNN thin film is formed by increasing the sputtering applied electric power on the (111) highly oriented Pt electrode, the variation (inclination) angles of the inclination (off) angles of the (001) preferentially oriented crystal grains with respect to the substrate are great.

Example 6

Example 6 will be described using FIG. 11.

Figure 11:
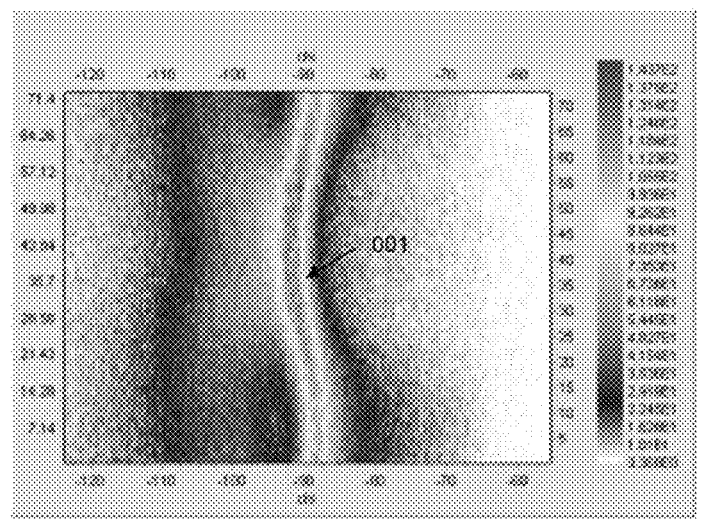
Figure 11:
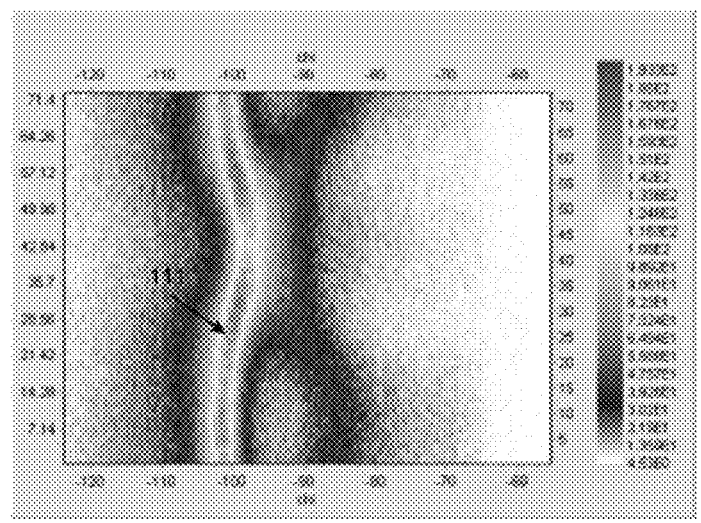

As example 6, FIG. 11 show a result of the pole figure measurement of the KNN thin film manufactured in a state of (001) and (111) preferential orientation. At this time, FIG. 11A shows a result of performing film deposition with the sputtering applied electric power set to 70 W on the Pt electrode of (111) low orientation, and FIG. 11B shows a result of performing film deposition with the sputtering applied electric power set to 70 W on the Pt electrode of high orientation. As is found by comparing FIG. 11A and FIG. 11B, it is found that the amplitudes and the widths of the Debye rings in (001) orientation are the same as those in (111) orientation. Namely, although the preferentially oriented crystal faces are different from each other, the inclination (off) angles and the variation (deviation) thereof with respect to the substrate surface are same. Namely, it is found that by changing the crystal orientation of the Pt electrode, the oriented crystal face of the KNN thin film formed thereon can be changed.

Example 7

Figure 12:
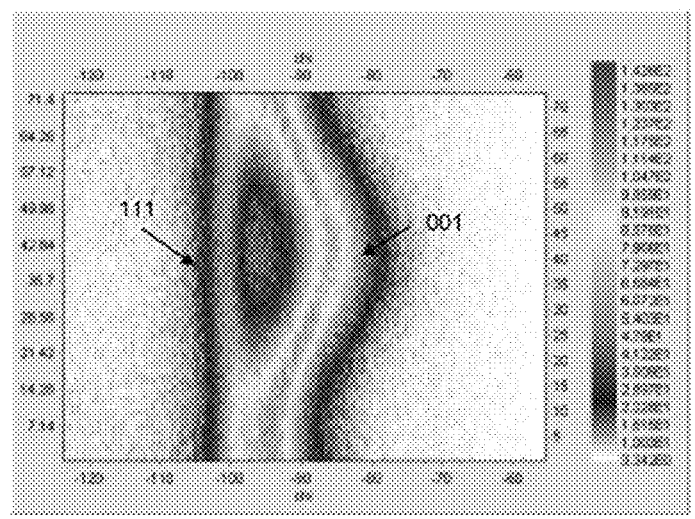
Figure 12:
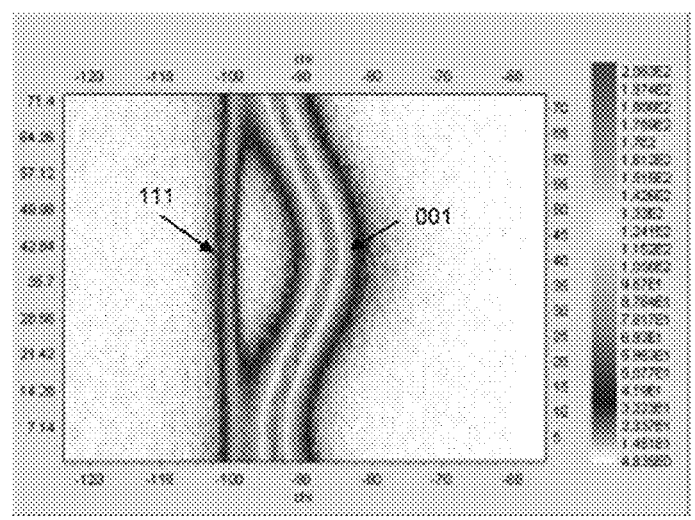
Figure 13:
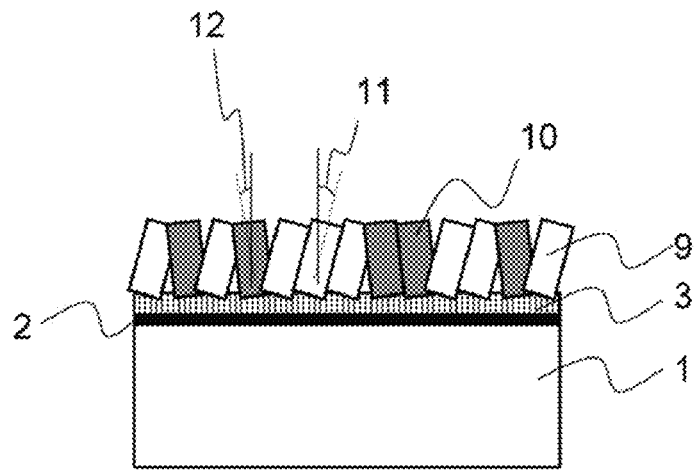
FIG. 13 is a sectional view showing a state in which each preferentially oriented crystal grain has inclination (off) angle with respect to the substrate surface of the KNN piezoelectric thin film in which (001) and (111) preferential orientations of example 7 of the present invention coexist.

Example 7 will be described using FIG. 12 and FIG. 13.
As the example 7, FIG. 12 shows a result of performing the pole figure measurement of the KNN piezoelectric thin film manufactured, with the variation (deviation) of the inclination (off) angles varied with respect to the substrate, regarding a state of coexistence of the crystal grains of the (001) and (111) preferentially oriented KNN thin film.
Here, FIG. 12A shows a result of performing film deposition with the sputtering applied electric power set to 100 W on Pt electrode of (111) low orientation, and FIG. 12B shows a result of performing film deposition with the sputtering applied electric power set to 100 W on the Pt electrode of (111) high orientation.
When FIG. 12A and FIG. 12B are compared, it is found that the amplitudes of both of (001) and (111) are the same. Namely, the inclination (off) angles of the preferentially oriented crystal grains with respect to the substrate surface are the same, in a coexistence state of the (001) and (111) preferentially oriented crystal grains.
Meanwhile, it is found that the widths of the Debye rings of (001) and (111) of FIG. 12A are apt to be greater. Namely, when the sputtering applied electric power is set to 100 W, which is higher than that of the example 6, and the KNN thin film is formed on the Pt electrode of (111) low orientation, the (001) and (111) preferentially oriented crystal grains have greater variation (inclination) of the inclination (off) angles with respect to the substrate surface. FIG. 13 shows a sectional schematic view of this example 7. The (001) preferentially oriented crystal grains ((001) axis orientation) 9, and the (111) preferentially oriented crystal grains ((111) axis orientation) 10 are set in a coexistence state. Each inclination (off) angle corresponds to 11 and 12, and the variation (deviation) thereof approximately corresponds to the width of each Debye ring of (111) and (001).

Example 8

Figure 14:
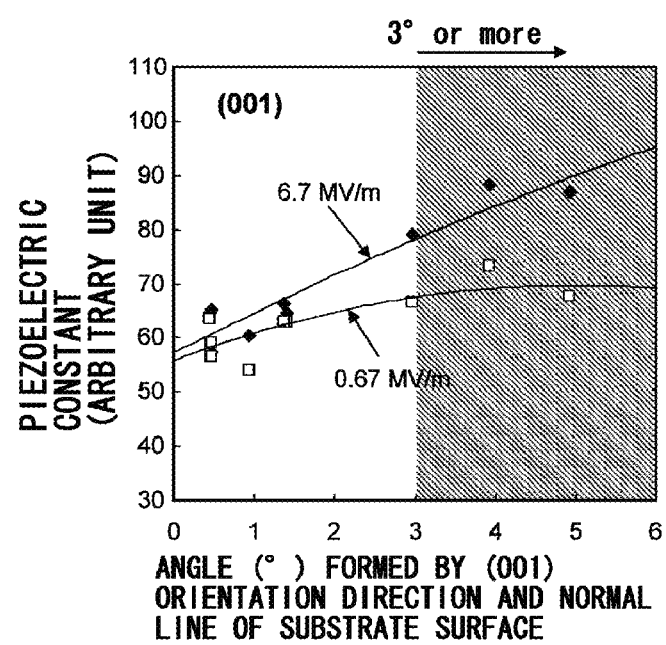
FIG. 14 is a correlation view between the inclination (off) angles with respect to the (001) preferentially oriented crystal grains and a piezoelectric constant, in the piezoelectric thin film element using the piezoelectric thin film according to example 8 of the present invention.

Example 8 will be described using FIG. 14 to FIG. 17.
FIG. 14 shows a correlation view of the inclination (off) angles of the crystal grains and the piezoelectric constant, with respect to the substrate surface of the (001) preferentially oriented KNN piezoelectric thin film. The horizontal axis of FIG. 14 shows inclination (off) angle δ of the (001) preferentially oriented crystal grains with respect to the substrate surface. Further, the vertical axis shows the piezoelectric constant. As a specific example of the vertical axis, $d_{33}$, being a variation amount of extension/contraction vertical to an electrode surface (in a thickness direction), or $d_{31}$, being a variation amount of extraction/contraction in a direction along the electrode surface, can be given.
An arbitrary unit is given as a unit here. The piezoelectric constant is set as the arbitrary unit, and this is because although numerical values of Young's modulus and Poisson's ratio of the piezoelectric thin film are necessary, it is not easy to obtain the numerical values of the Young's modulus and Poisson's ratio of the piezoelectric thin film. Particularly, in a case of the thin film, an influence (binding effect) is received from the substrate used in the film deposition, unlike a bulk material, and therefore it is difficult to principally obtain an absolute value (true value) of the Young's modulus and the Poisson's ratio (constant) of the thin film itself. Therefore, the piezoelectric constant is calculated by using an estimated value of the Young's modulus and the Poisson's ratio of the KNN thin film which has been known heretofore. Accordingly, the obtained piezoelectric constant is an estimated value, and therefore the piezoelectric constant is set as a relatively arbitrary unit objectively. However, although the Young's modulus and the Poisson's ratio of the KNN thin film used in calculating the piezoelectric constant is the estimated value, they are reliable values to some degree, and it can be said that about 90 (arbitrary unit) of the piezoelectric constant means about 90 (−pm/V) of the piezoelectric constant d31.
As is clarified from FIG. 14, it is found that as the inclination (off) angles of the crystal grains having (001) preferential orientation become greater, the piezoelectric constant becomes greater. At, this time, it is found that similar variation is shown, irrespective of the magnitude of an applied electric field. Also, it is found that at angles of about 3° to 4°, the piezoelectric constant becomes greater, and at angles of 4° to 5°, high piezoelectric constants are maintained. Further, even at angles of 5° or more, the high piezoelectric constants are likely to be maintained.
Namely, in order to realize the KNN piezoelectric thin film element having the piezoelectric constant that can be applied to an actuator and a sensor, etc, the inclination (off) angle of the crystal grain with (001) preferential orientation is preferably set to 3° or more.
Table 1 corresponds to FIG. 14, and FIG. 14 shows the table 1 in a form of graph.

TABLE 1

| Sample | Angle (°) between <001> and normal line | Piezoelectric constant @6.7 MV/m | Piezoelectric constant @0.67 MV/m |
| --- | --- | --- | --- |
| Sample 1 | 1.40 | 65 | 63 |
| Sample 2 | 1.38 | 66 | 63 |
| Sample 3 | 0.47 | 57 | 57 |
| Sample 4 | 4.93 | 87 | 68 |
| Sample 5 | 3.93 | 88 | 73 |
| Sample 6 | 0.47 | 65 | 59 |
| Sample 7 | 0.94 | 60 | 54 |
| Sample 8 | 0.44 | 65 | 63 |
| Sample 9 | 2.97 | 79 | 66 |

Figure 15:
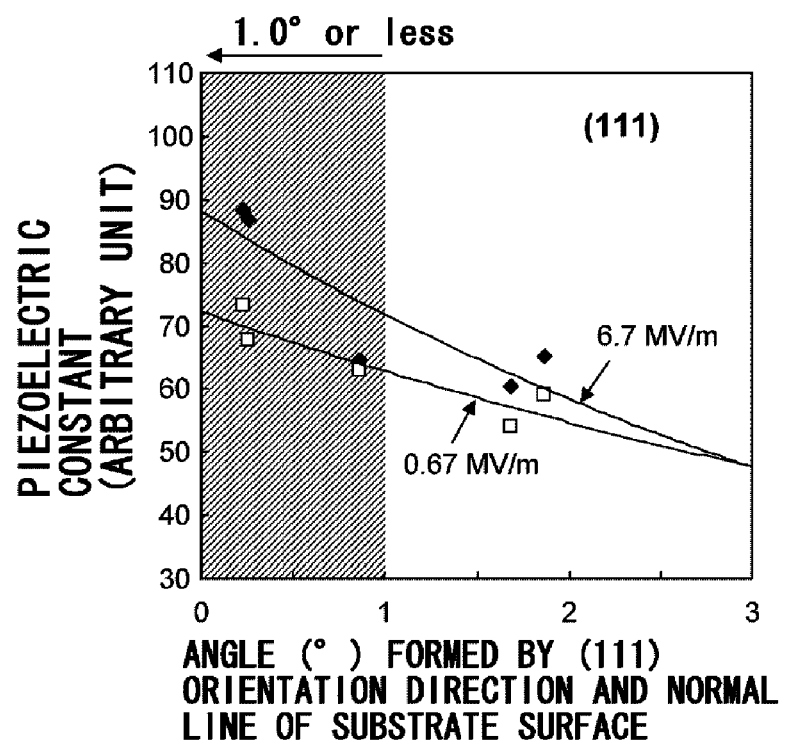
FIG. 15 is a correlation view between the inclination (off) angles with respect to the (111) preferentially oriented crystal grains and the piezoelectric constant, in the piezoelectric thin film element using the piezoelectric thin film according to example 8 of the present invention.

Further, FIG. 15 shows the correlation of the inclination (off) angles of the crystal grains and the piezoelectric constant with respect to the substrate surface of the (111) preferentially oriented KNN piezoelectric thin film. The horizontal axis of FIG. 15 shows the inclination (off) angles of the (111) preferentially oriented crystal grains with respect to the substrate surface. In FIG. 15, it is found that as the inclination (off) angles of the (111) preferentially oriented crystal grains become smaller, the piezoelectric constant becomes greater.
Further, the same tendency is shown irrespective of small and large of the applied electric field. However, it is found that when the inclination (off) angles of the (111) preferentially oriented crystal grains are 1° or less, the piezoelectric constant with the applied electric field set to 6.7 MV/m becomes suddenly great, compared with the piezoelectric constant with the applied electric filed set to 0.67 MV/m. Accordingly, in order to stably obtain a high piezoelectric constant, it is desirable to control the inclination (off) angles of the crystal grains having the (111) preferential orientation to 1° or less.

Table 2 corresponding to FIG. 15 is shown below.

TABLE 2

| Sample | Angle (°) between <111> and normal line | Piezoelectric constant @6.7 MV/m | Piezoelectric constant @0.67 MV/m |
|---|---|---|---|
| Sample A | 1.40 | 65 | 63 |
| Sample B | 4.93 | 87 | 68 |
| Sample C | 3.93 | 88 | 73 |
| Sample D | 0.47 | 65 | 59 |
| Sample E | 0.94 | 60 | 54 |

Figure 16:
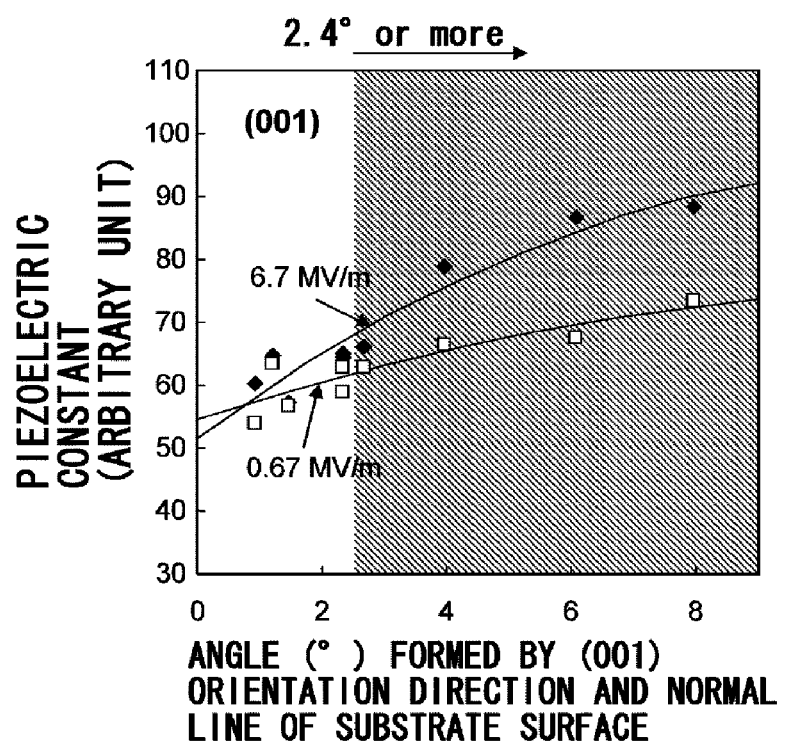
FIG. 16 is a correlation view between the variation (deviation) of the inclination (off) angles with respect to the substrate of the (001) preferentially oriented crystal grains and the piezoelectric constant, in the piezoelectric thin film element using the piezoelectric thin film according to example 8 of the present invention.

Next, FIG. 16 shows the correlation view of the variation (deviation) of the inclination (off) angles and the piezoelectric constant of the crystal grains, with respect to the substrate surface of the (001) preferentially oriented KNN piezoelectric thin film. Note that the variation (deviation) obtained here is a half value width obtained when function fitting is performed to a peak profile of X-ray diffraction observed when the Debye ring is cut in parallel to the X($\alpha$) axis.

FIG. 16 shows a tendency of the piezoelectric constant becoming greater, as the variation of the inclination (off) angles of the (001) preferentially oriented crystal grain becomes greater.

When FIG. 16 is referenced, the inclination (off) angle of the crystal grain with (001) preferential orientation is preferably set to 1.2° or more, to obtain excellent piezoelectric constant.

Particularly, the piezoelectric constant seems to be increased particularly from 2.4 or more. Accordingly, in order to stably obtain a high piezoelectric constant, it is desirable to control the variation of the inclination (off) angles of the (001) preferentially oriented crystal grains or the half width value of the Debye ring of (001) to 2.4° or more.

Table 3 corresponding to FIG. 16 is shown below.

TABLE 3

| Sample | Deviation (°) between <001> and normal line | Piezoelectric constant @6.7 MV/m | Piezoelectric constant @0.67 MV/m |
|---|---|---|---|
| Sample 1 | 2.34 | 65 | 63 |
| Sample 2 | 2.67 | 66 | 63 |
| Sample 3 | 1.45 | 57 | 57 |
| Sample 4 | 6.08 | 87 | 68 |
| Sample 5 | 7.95 | 88 | 73 |
| Sample 6 | 2.34 | 65 | 59 |
| Sample 7 | 0.94 | 60 | 54 |
| Sample 8 | 1.22 | 65 | 63 |
| Sample 9 | 3.98 | 79 | 66 |

Figure 17:
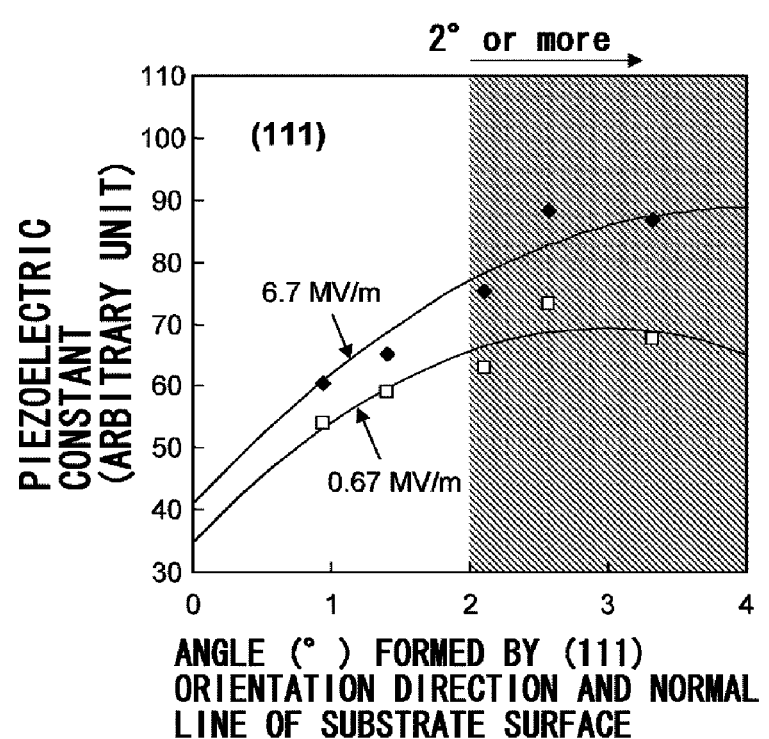
FIG. 17 is a correlation view between the variation (deviation) of the inclination (off) angles with respect to the substrate of the (111) preferentially oriented crystal grains and the piezoelectric constant, in the piezoelectric thin film element using the piezoelectric thin film according to example 8 of the present invention.

Meanwhile, FIG. 17 shows the correlation view of the variation (deviation) of the inclination (off) angles and the piezoelectric constant of the crystal grains with respect to the substrate surface of the (111) preferentially oriented KNN piezoelectric thin film. In this figure, it is found that as the variation of the inclination (off) angles of the (111) preferentially oriented crystal grains become greater, the piezoelectric constant becomes greater, irrespective of the magnitude of the applied electric field. When FIG. 17 is referenced, the variation (deviation) of the inclination (off) angles of the crystal grain with respect to the substrate surface of the (111) preferentially oriented KNN piezoelectric thin film is preferably set to 1° or more. Further, the piezoelectric constant becomes great in a range of about 2° to 2.5°. However, when the variation of the off angles becomes great, it is found that there is almost no variation in the piezoelectric constant (the high piezoelectric constant is likely to be maintained). Accordingly, the excellent piezoelectric constant can be obtained, by making the variation (deviation) of the inclination (off) angles of the crystal grain with respect to the substrate surface of the (111) preferentially oriented KNN piezoelectric thin film set to 2° or more.

Table 4 corresponding to FIG. 17 is shown below.

TABLE 4

| Sample | Deviation (°) between <111> and normal line | Piezoelectric constant @6.7 MV/m | Piezoelectric constant @0.67 MV/m |
|---|---|---|---|
| Sample A | 2.34 | 65 | 63 |
| Sample B | 6.08 | 87 | 68 |
| Sample C | 7.95 | 88 | 73 |
| Sample D | 2.34 | 65 | 59 |
| Sample E | 0.94 | 60 | 54 |

As described above, according to the example 8, it is found that by independently and precisely controlling the angle formed by the crystal orientation direction and the normal line of the substrate surface, or the deviation of the angle formed by them, the piezoelectric thin film having a high piezoelectric constant can be stably obtained, and by realizing the KNN piezoelectric thin film with crystal orientation precisely controlled, a new piezoelectric thin film element with high performance and the piezoelectric thin film device using the same can be manufactured.

An example of a specific manufacturing condition is as follows.

A sample (called an example sample hereafter) of the piezoelectric thin film element obtained in example 8 will be described below.

The piezoelectric thin film of the example sample was set in a coexistence state of the (001) preferentially oriented crystal grain and the (111) preferentially oriented crystal grain, wherein the inclination of the crystal axis of the (001) preferentially oriented crystal grain with respect to the substrate was 3.0°, and the inclination of the crystal axis of the (111) preferentially oriented crystal grain with respect to the substrate was 0.5°.

The piezoelectric constant of this example sample indicated 87 when a voltage of 6.7 MV/m was applied.

As, the manufacturing condition at this time, a Si substrate of 0.5 mm was prepared as the substrate, and thermal oxidation film treatment was applied to the surface, to thereby form an oxide film of 150 nm on the surface of the Si substrate. Next, a Ti adhesive layer of 2 nm was formed on the thermal oxidation film, and Pt lower electrode of 100 nm formed preferentially oriented in (111) was formed on the Ti adhesive layer. The Ti adhesive layer and Pt lower electrode were formed, under conditions of substrate temperature: 350° C., supplied electric power: 100 W, Ar gas 100% atmosphere, gas pressure: 2.5 Pa, film deposition time: 1-3 minutes (Ti adhesive layer) and 10 minutes (Pt lower electrode).

Film deposition of the KNN piezoelectric thin film formed on the Pt lower electrode was performed by sputtering until the film thickness reached 3 μm, by using a ceramic target as a target (Na$_x$K$_y$Li$_z$) NbO3 x=0.5, y=0.5, z=0, and target-density 4.6 g/cm$^3$. The substrate temperature during film deposition was set to 700° C., supplied electric power was set to 100 W, mixed gas of Ar and O$_2$ gases in a ratio of 5:5 was used, and pressure was set to 1.3 Pa. Further, a shift amount of a target center from a substrate center was set to 10 mm. Note that a self-revolving furnace was used in a sputtering device, and inter-TS distance was set to 50 mm.

Thus, the excellent piezoelectric characteristics can be realized, by controlling film deposition conditions such as each constitutional material of the piezoelectric thin film element and film deposition temperature, and controlling the inclination of the preferentially oriented crystal grain.

As described above, the present invention can be executed by various embodiments, and therefore the range of the present invention is not limited to the embodiments and the examples. The range of the present invention is defined by claims, and all changes within the scope of the claims or equivalent thereto are incorporated in these claims.

What is claimed is:

1. A piezoelectric thin film element, comprising on a substrate:
    a piezoelectric thin film expressed by a general formula $(Na_xK_yLi_z)NbO_3$ wherein $0<x<1$, $0<y<1$, $0<z<0.2$, and wherein $x+y+z=1$; and
    an upper electrode laminated thereon, wherein the piezoelectric thin film has a crystal structure of any one of a pseudo-cubic crystal, a tetragonal crystal, or an orthorhombic crystal, or has a crystal structure of coexistence of at least two of the pseudo-cubic crystal, the tetragonal crystal, or the orthorhombic crystal, and in such crystal structures, there is a coexistence of (001) oriented crystal grains oriented in (001) direction, and (111) oriented crystal grains oriented in (111) direction, with an angle formed by at least one of the crystal axes of the crystal grains and a normal line of the substrate surface set to be in a range of 0° to 10°.

2. The piezoelectric thin film element according to claim 1, wherein the piezoelectric thin film has a crystal texture constituted of particles of a columnar structure.

3. The piezoelectric thin film element according to claim 2, wherein the normal line of (001), being a specific crystal face, is oriented preferentially in a vertical direction to the substrate surface, and the angle formed by the normal line of the crystal face and the normal line of the substrate surface is set to be 3° or more.

4. The piezoelectric thin film element according to claim 2, wherein the normal line of (111), being the specific crystal face, is oriented preferentially in the vertical direction to the substrate surface, and the angle formed by the normal line of the crystal face and the normal line of the substrate surface is set to be 1° or less.

5. The piezoelectric thin film element according to claim 2, wherein the normal line of (001), being the specific crystal face, is oriented preferentially in the vertical direction to the substrate surface, and a deviation of the angle from a central value of the angle formed by the normal line of the crystal face and the normal line of the substrate surface is 1.2° or more.

6. The piezoelectric thin film element according to claim 2, wherein the normal line of (001), being the specific crystal face, is oriented preferentially in the vertical direction to the substrate surface, and a width of a Debye ring of (001) in a pole figure measurement of the piezoelectric thin film element is 2.4° or more.

7. The piezoelectric thin film element according to claim 2, wherein the normal line of (111), being the crystal face, is oriented preferentially in the vertical direction to the substrate surface, and the deviation of the angle from the central value of the angle formed by the normal line of the crystal face and the normal line of the substrate surface is 1° or more.

8. The piezoelectric thin film element according to claim 2, wherein the normal line of (111), being the specific crystal face, is oriented preferentially in the vertical direction to the substrate surface, and the width of the Debye ring of (111) in the pole figure measurement of the piezoelectric thin film element is 2° or more.

9. The piezoelectric thin film element according to claim 2, wherein an underlayer is provided between the substrate and the piezoelectric thin film.

10. The piezoelectric thin film element according to claim 1, wherein the normal line of (001), being a specific crystal face, is oriented preferentially in a vertical direction to the substrate surface, and the angle formed by the normal line of the crystal face and the normal line of the substrate surface is set to be 3° or more.

11. The piezoelectric thin film element according to claim 1, wherein the normal line of (111), being the specific crystal face, is oriented preferentially in the vertical direction to the substrate surface, and the angle formed by the normal line of the crystal face and the normal line of the substrate surface is set to be 1° or less.

12. The piezoelectric thin film element according to claim 1, wherein the normal line of (001), being the specific crystal face, is oriented preferentially in the vertical direction to the substrate surface, and a deviation of the angle from a central value of the angle formed by the normal line of the crystal face and the normal line of the substrate surface is 1.2° or more.

13. The piezoelectric thin film element according to claim 1, wherein the normal line of (001), being the specific crystal face, is oriented preferentially in the vertical direction to the substrate surface, and a width of a Debye ring of (001) in a pole figure measurement of the piezoelectric thin film element is 2.4° or more.

14. The piezoelectric thin film element according to claim 1, wherein the normal line of (111), being the crystal face, is oriented preferentially in the vertical direction to the substrate surface, and the deviation of the angle from the central value of the angle formed by the normal line of the crystal face and the normal line of the substrate surface is 1° or more.

15. The piezoelectric thin film element according to claim 1, wherein the normal line of (111), being the specific crystal face, is oriented preferentially in the vertical direction to the substrate surface, and the width of the Debye ring of (111) in the pole figure measurement of the piezoelectric thin film element is 2° or more.

16. The piezoelectric thin film element according to claim 1, wherein an underlayer is provided between the substrate and the piezoelectric thin film.

17. The piezoelectric thin film element according to claim 16, wherein the underlayer is an electrode layer including Pt or an alloy mainly composed of Pt, or including the electrode layer mainly composed of Pt.

18. The piezoelectric thin film element according to claim 1, wherein an upper electrode is formed on the piezoelectric thin film.

19. A piezoelectric thin film device, including the piezoelectric thin film element according to claim 1, and a voltage application part, or a voltage detection part.

* * * * *